(12) United States Patent
Lu et al.

(10) Patent No.: US 9,535,334 B2
(45) Date of Patent: Jan. 3, 2017

(54) EXTREME ULTRAVIOLET LITHOGRAPHY PROCESS TO PRINT LOW PATTERN DENSITY FEATURES

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 293 days.

(21) Appl. No.: 14/289,474

(22) Filed: May 28, 2014

(65) Prior Publication Data
US 2015/0116685 A1  Apr. 30, 2015

Related U.S. Application Data

(60) Provisional application No. 61/898,348, filed on Oct. 31, 2013.

(51) Int. Cl.
*G03B 27/32* (2006.01)
*G03B 27/54* (2006.01)
(Continued)

(52) U.S. Cl.
CPC ......... *G03F 7/70191* (2013.01); *G03F 1/0046* (2013.01); *G03F 1/24* (2013.01); *G03F 1/26* (2013.01); *G03F 7/70091* (2013.01); *G03F 7/70116* (2013.01); *G03F 7/70125* (2013.01); *G03F 7/70283* (2013.01); *G03F 7/70308* (2013.01)

(58) Field of Classification Search
CPC ............ G03F 1/0046; G03F 1/24; G03F 1/26; G03F 7/70091; G03F 7/701; G03F 7/70116; G03F 7/70125; G03F 7/702
USPC .................................. 355/67, 71, 77; 430/5
See application file for complete search history.

(56) References Cited

U.S. PATENT DOCUMENTS

| 5,329,333 A * | 7/1994 | Noguchi | ............... G03F 7/2002 355/53 |
| 2005/0282072 A1* | 12/2005 | Hector | ................... B82Y 10/00 430/5 |

(Continued)

OTHER PUBLICATIONS

Chen, Alek; "EUV: Current Status and Future Challenges" Sematech Symposium, Hsinchu Taiwan, Oct. 18, 2012.*

(Continued)

Primary Examiner — Colin Kreutzer
(74) Attorney, Agent, or Firm — Haynes and Boone, LLP

(57) ABSTRACT

The present disclosure provides a method for extreme ultraviolet lithography (EUVL) process. The method includes loading a binary phase mask (BPM) to a lithography system, wherein the BPM includes two phase states and defines an integrated circuit (IC) pattern thereon; setting an illuminator of the lithography system in an illumination mode according to the IC pattern; configuring a pupil filter in the lithography system according to the illumination mode; and performing a lithography exposure process to a target with the BPM and the pupil filter by the lithography system in the illumination mode.

19 Claims, 15 Drawing Sheets

(51) Int. Cl.
*G03B 27/72* (2006.01)
*G03F 1/00* (2012.01)
*G03F 7/20* (2006.01)
*G03F 1/24* (2012.01)
*G03F 1/26* (2012.01)

(56) References Cited

U.S. PATENT DOCUMENTS

2007/0121090 A1* 5/2007 Chen .................. G03F 7/70283
  355/67
2013/0132037 A1* 5/2013 Kempter ............. G03F 7/70116
  702/189
2014/0011120 A1  1/2014 Lu et al.

OTHER PUBLICATIONS

U.S. Appl. No. 13/946,533, filed Jul. 19, 2013, by inventors Yen-Cheng Lu, Shinn-Sheng Yu, Jeng-Horng Chen, and Anthony Yen for "An Extreme Ultraviolet Lithography Process and Mask," 15 pages of text, 4 pages of drawings.

U.S. Appl. No. 14/221,555, filed Mar. 21, 2014, by inventors Yen-Cheng Lu, Shinn-Sheng Yu, Jeng-Horng Chen, and Anthony Yen for "An Extreme Ultraviolet Lithography Process and Mask with Reduced Shadow Effect and Enhanced Intensity," 27 pages of text, 8 pages of drawings.

\* cited by examiner

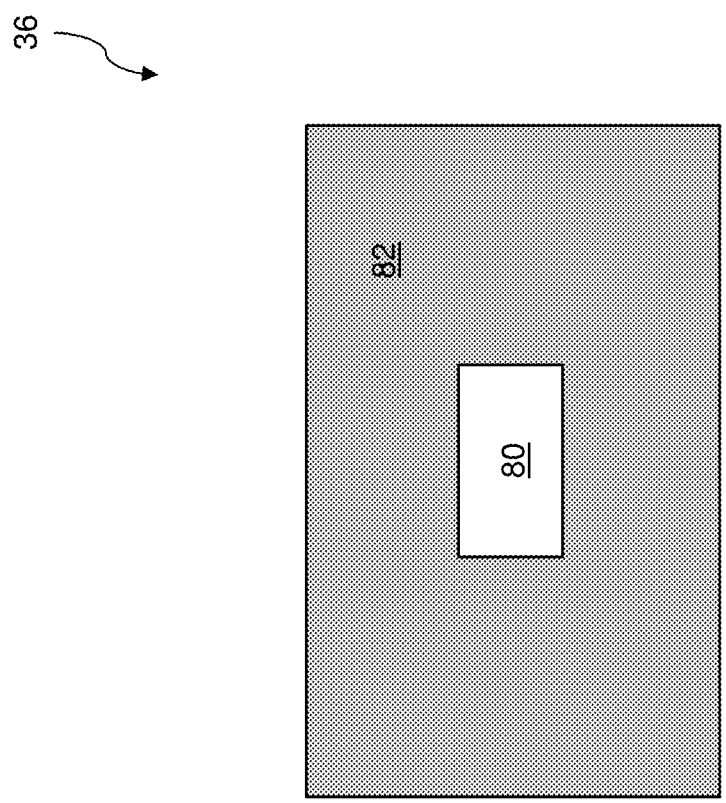

EXTREME ULTRAVIOLET LITHOGRAPHY PROCESS TO PRINT LOW PATTERN DENSITY FEATURES

CROSS-REFERENCE

This application claims priority to U.S. Provisional Patent Application Ser. No. 61/898,348, filed on Oct. 31, 2013, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region. EUV scanners provide the desired pattern on an absorption layer ("EUV" mask absorber) formed on a reflective mask. Currently, binary intensity masks (BIM) are employed in EUVL for fabricating integrated circuits. For EUV light, all materials are highly absorbing. Thus, reflective optics rather than refractive optics is used. A reflective mask is used. However, the reflectance of EUV mask is very low. The EUV energy is substantially lost on the optical path. The EUV energy reaching the wafer is much less. There are other issues including low throughput issue, especially for a via layer due to the low transmittance through the via.

Therefore, what is needed is the method for a lithography process and the mask structure utilized in the method to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a top view of a binary phase mask constructed according to aspects of the present disclosure in one or more embodiment.

DETAILED DESCRIPTION

Figure 1:
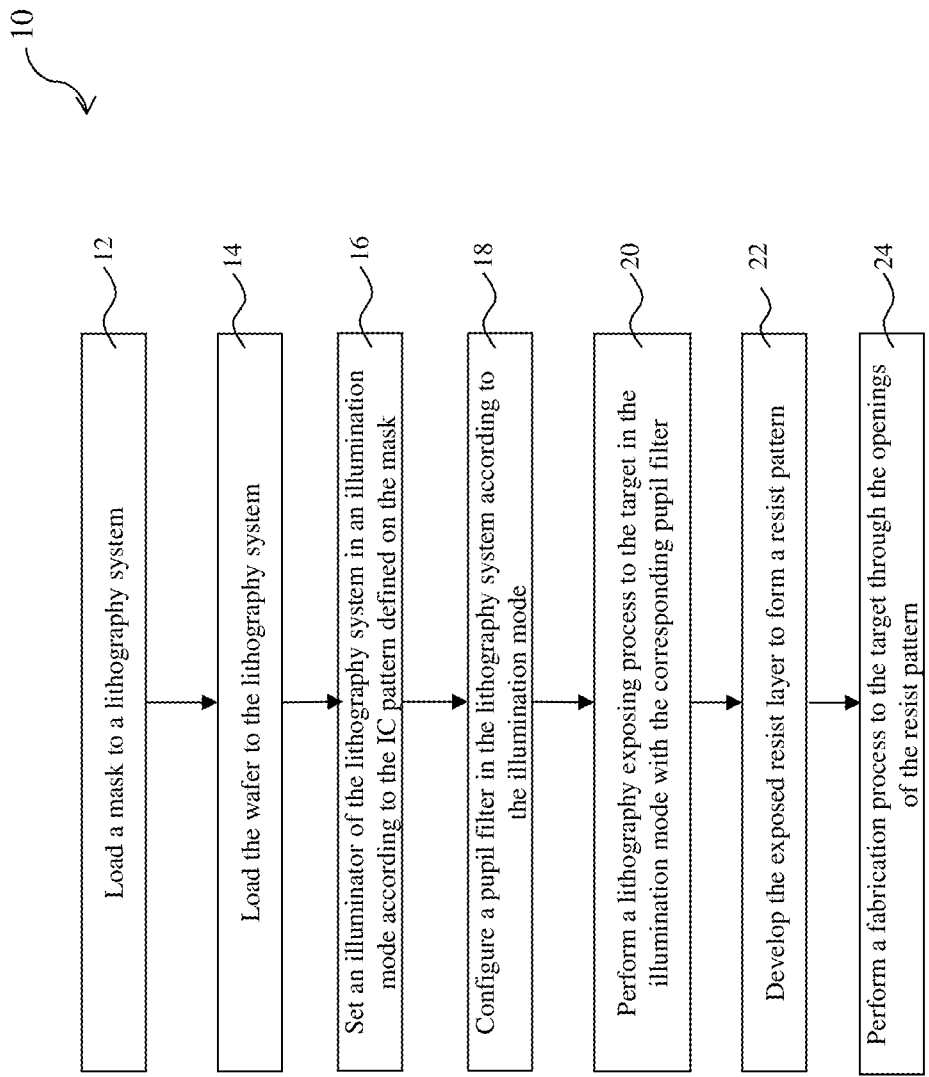
FIG. 1 is a flowchart of a lithography process constructed according to aspects of the present disclosure in various embodiments.

The following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 10 to perform a lithography process in an integrated circuit fabrication constructed according to aspects of the present disclosure in various embodiments. The method 10, the lithography system and the photomake used by the method 10 are described with reference to FIG. 1 and other figures.

Referring to FIG. 1, the method 10 includes an operation 12 by loading to a lithography system 30 with a photomask (mask or reticle) 36. In the present disclosure, the mask 36 is designed to have phase shift and with two mask states. Therefore, the mask 36 is a phase shift mask with two phase states, therefore being referred to as binary phase mask (BPM). The lithography system 30 and the mask 36 are described below respectively.

Figure 2:
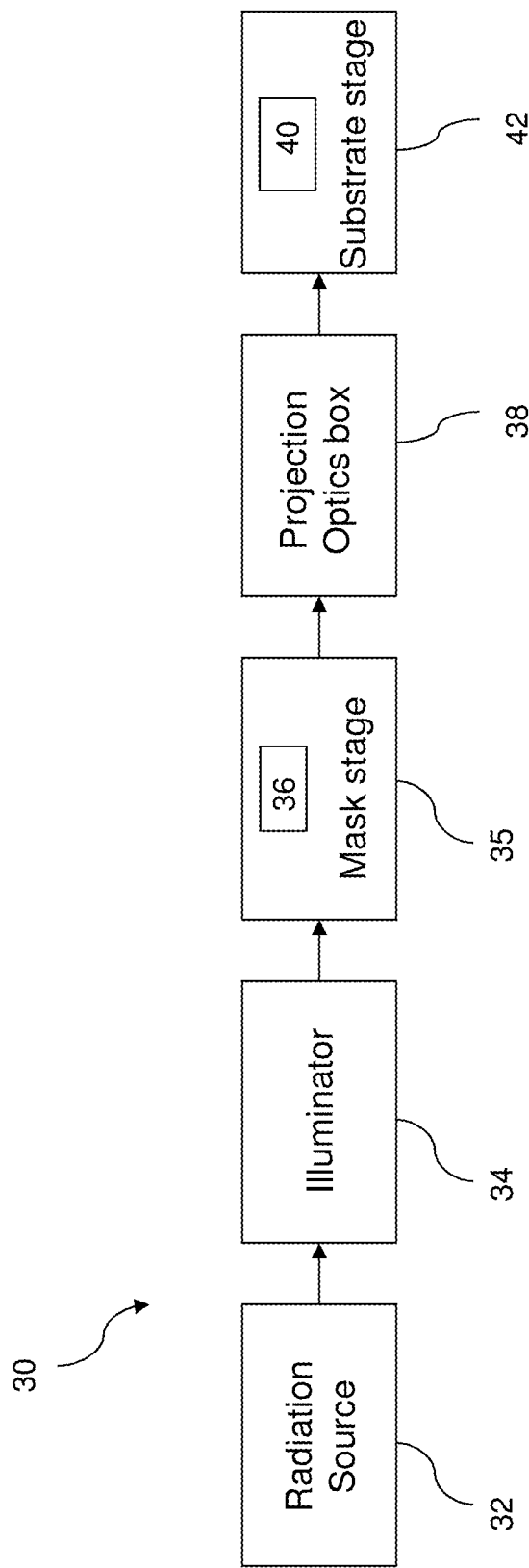
FIG. 2 is a block diagram of a lithography system for implementing a mask structure constructed according to aspects of the present disclosure in one or more embodiment.

FIG. 2 illustrates a block diagram of the lithography system 30 for performing a lithography exposure process. The lithography system 30 is also illustrated, in portion, in FIG. 3 in a schematic view. In the present embodiment, the lithography system 30 is an extreme ultraviolet (EUV) lithography system designed to expose a resist (or photoresist) layer by EUV. The resist layer is sensitive to the EUV radiation. The EUV lithography system 30 employs a radiation source 32 to generate EUV light, such as EUV light having a wavelength ranging from about 1 nm to about 100 nm. In one particular example, the EUV radiation source 32 generates a EUV light with a wavelength centered at about 13.5 nm.

The EUV lithography system 30 also employs an illuminator 34. In various embodiments, the illuminator 34 includes various refractive optic components, such as a single lens or a lens system having multiple lenses (zone plates) or reflective optics, such as a single mirror or a mirror system having multiple mirrors in order to direct light from the radiation source 32 onto a mask 36. In the present embodiment where the radiation source 32 that generates light in the EUV wavelength range, reflective optics is employed. Refractive optics, however, can also be realized by zoneplates for example. In the present embodiment, the illuminator 34 is operable to configure the mirrors to provide an off-axis illumination (OAI) to illuminate the mask 36. In one example, the mirrors of the illuminator 34 are switchable to reflect EUV light to different illumination positions. In another embodiment, a stage prior to the illuminator 34 may additionally include other switchable mirrors that are controllable to direct the EUV light to different illumination positions with the mirrors of the illuminator 34. Accordingly, the lithography system 30 is able to achieve different illumination modes without sacrificing the illumination energy.

The EUV lithography system 30 also includes a mask stage 35 configured to secure a photomask 36 (in the present disclosure, the terms of mask, photomask, and reticle are used to refer to the same item). The mask 36 may be a transmissive mask or a reflective mask. In the present embodiment, the mask 36 is a reflective mask such as described in further detail below.

The EUV lithography system 30 also employs the POB 38 for imaging the pattern of the mask 36 on to a target 40 (such as a semiconductor wafer) secured on a substrate stage 42 of the lithography system 30. The POB 38 may have refractive optics or reflective optics. The radiation reflected from the mask 36 (e.g., a patterned radiation) is collected by the POB 38. In one embodiment, the POB 38 may include a magnification of less than one (thereby reducing the patterned image included in the radiation).

The structure of the mask 36 and the method making the same will be further described later according to various embodiments. The mask fabrication process includes two operations: a blank mask fabrication process and a mask patterning process. During the blank mask fabrication process, a blank mask is formed by depositing suitable layers (e.g., multiple reflective layers) on a suitable substrate. The blank mask is patterned during the mask patterning process to have a design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. Several masks (for example, a set of 15 to 30 masks) may be used to construct a complete IC. In general, various masks are fabricated for being used in various processes.

The mask 36 incorporates phase-shifting mask (PSM) technique and is designed to achieve the enhanced illumination intensity when used with the lithography system 30 and the method 10. In the present embodiment, the mask 36 is a binary phase mask. FIG. 4 illustrates a top view of the mask 36 and FIG. 5A is a sectional view of the mask 36, constructed according to aspects of the present disclosure.

Referring to FIG. 4, the mask 36 includes a plurality of main features (main polygons) 80. The rest region without main patterns is referred to as field 82. A main polygon is a IC feature or a portion of the IC feature that will be imaged to the target 40 (a wafer in the present example). In one example, the main feature 80 is an opening that defines a via in a via layer (or a contact in a contact layer) to be formed on the semiconductor wafer. The pattern in the mask 36 defines the via layer with a plurality of vias (or the contact layer with plurality of contacts). In another example, the main feature 80 is an opening that defines a cut feature for double or multiple patterning. The pattern in the mask 36 defines a cut pattern with a plurality of cut features designed to form a circuit pattern (such as gates or metal lines) with one or more main pattern defined on corresponding mask by two or more exposures. Double patterning as one example of the multiple patterning is further described to illustrate the cut pattern. During double patterning, a first mask defines main features (such as metal lines) and a second mask defines cut features where each cut feature break (cut) the corresponding main feature (such as one metal line) into two main features (such as two metal lines) through a double patterning process. In yet another embodiment, the pattern in the mask 36 may further include other features, such as optical proximity correction (OPC) features to enhance imaging effect and/or dummy features to improve performance of other fabrication operations (such as CMP, and thermal annealing). In the present embodiment, the pattern density of the pattern on the mask 36 has a low pattern density, such as lower than about 25% in one example. In other example such as a pattern with a reversed tone where the pattern density is calculated by the complimentary areas on the mask, the pattern density is greater than 75%.

Figure 5A:
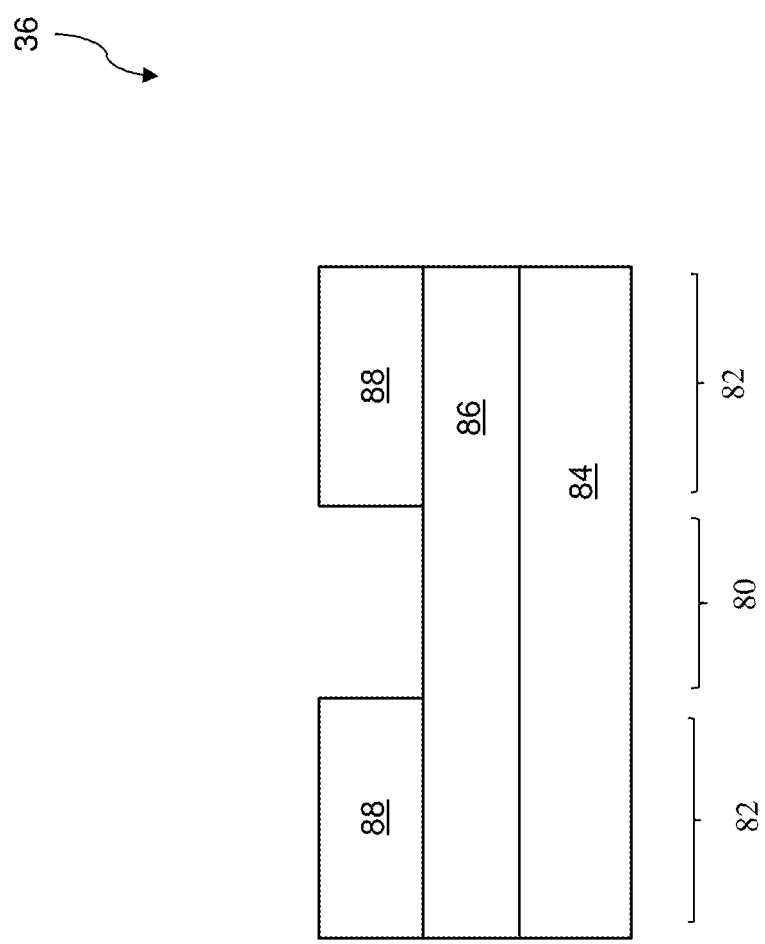
FIGS. 5A and 5B are diagrammatic cross-sectional views of the binary phase mask constructed according to aspects of the present disclosure in two embodiments.

Referring to FIG. 5A, the mask 36 includes a mask substrate 84, such as a substrate made of low thermal expansion material (LTEM). In various example, the LTEM material includes $TiO_2$ doped $SiO_2$, or other low thermal expansion materials with low thermal expansion. The mask substrate 84 serves to minimize image distortion due to mask heating or other factors. In furtherance of the present embodiment, the mask substrate 84 of the LTEM includes a suitable material with a low defect level and a smooth surface. In another embodiment, a conductive layer may be additionally disposed on back surface of the mask substrate 84 for the electrostatic chucking purpose. In one example, the conductive layer includes chromium nitride (CrN), though other compositions are possible.

The mask 36 includes a reflective multilayer (ML) 86 disposed over the mask substrate 84 on the front surface. The ML 86 is also referred to as a first reflective layer, to avoid confusion when another reflective layer to be introduced later. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let lights reflected from different interfaces interfere constructively by choosing appropriate thickness for each layer inside the multilayer. However, the absorption of the employed materials for the multilayer limits the highest reflectivity that can be achieved. The ML 86 includes a plurality of film pairs, such as molybdenum-silicon (Mo/Si) film pairs (e.g., a layer of molybdenum above or below a layer of silicon in each film pair). Alternatively, the ML 86 may include molybdenum-beryllium (Mo/Be) film pairs, or any suitable material that is highly reflective at EUV wavelengths. The thickness of each layer of the ML 86 depends on the EUV wavelength and the incident angle. The thickness of the ML 86 is adjusted to achieve a maximum constructive interference of the EUV light reflected at each interface and a minimum absorption of the EUV light by the ML 86. The ML 86 may be selected such that it provides a high reflectivity to a selected radiation type and/or wavelength. In a typical example, the number of the film pairs in the ML 86 ranges from 20 to 80, however any number of film pairs is possible. In one example, the ML 86 includes forty pairs of layers of Mo/Si. In furtherance of the example, each Mo/Si film pair has a thickness of about 7 nm (a Mo film of about 3 nm thick and a Si film of about 3 nm thick), with a total thickness of 280 nm. In this case, a reflectivity of about 70% is achieved.

A capping layer may be formed above the ML 86 for one or more functions. In one example, the capping layer functions as an etch stop layer in a patterning process or other operations, such as repairing or cleaning. In another example, the capping layer functions to prevent oxidation of the ML 86. The capping layer may include one or more films to achieve the intended functions. In one example, the capping layer has different etching characteristics from a second reflective layer 88, which will be described later. In another example, the capping layer includes ruthenium (Ru). In furtherance of the example, the capping layer includes a Ru film with a thickness ranging from about 2 nm to about 5 nm. In other examples, the capping layer may include Ru compounds such as RuB, RuSi, chromium (Cr), Cr oxide, or Cr nitride. A low temperature deposition process may be chosen to form the capping layer to prevent inter-diffusion of the ML 86.

The mask 36 further includes the second reflective layer 88 formed above the first reflective layer (the ML layer) 86. The second reflective layer 88 is designed (such as by composition, configuration and thickness) to reflect the EUV light without absorption or lest absorption to avoid energy loss. The second reflective layer 88 is designed to further provide a phase shift to the reflected EUV light relative to the reflective EUV light from the first reflective layer 86. In the present embodiment, the phase difference of the reflected EUV lights from the first and second reflective layers is substantially 180° or close to 180° such that to achieve the enhanced exposure intensity during the lithography exposure process. Accordingly, the second reflective layer 88 functions as a phase shift and is a phase shift material layer.

The second reflective layer 88 is patterned according to an integrated circuit pattern having various main features 80. In one embodiment where the capping layer is present, the second reflective layer 88 is formed above the capping layer.

Thus, the mask 36 is a phase shift mask with two states, a first mask state and a second mask state. Both mask states substantially reflect the EUV light but with a phase difference (180° in the present embodiment). The first mask state is defined in the regions of the first reflective layer 86 within the openings of the second reflective layer 88, such as the main feature 80 being defined in the first mask state. The second mask state is defined in the regions of the second reflective layer 88, such as the field 82 being defined in the second first mask state. Thus, the mask 36 is a binary phase mask or BPM. The IC pattern with low pattern density is defined below according to various embodiments. In the BPM 36, the first area S1 associated with the first mask state and the second area S2 associated with second mask state have a ratio in a certain range. In one embodiment, the ratio S1/S2 is less than about ⅓, such as the mask of the first type illustrated in FIG. 5A as one example. In an alternative embodiment, the ratio S1/S2 is greater than about 3, such as the mask of the second type illustrated in FIG. 5B as an example.

In a conventional binary intensity mask (BIM), the patterned layer is an absorption layer. Different from the BIM, the absorption layer is replaced by a phase shift material layer in the BPM.

Figure 5B:
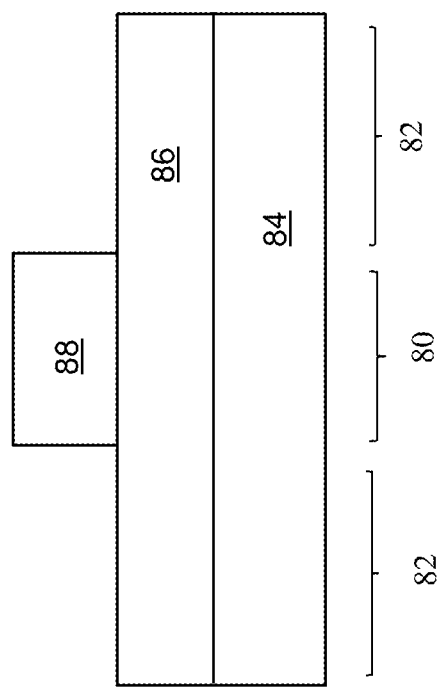

FIG. 5A illustrates the mask 36 of the first type. The mask 36 of the second type is illustrated in FIG. 5B. The mask 36 inn FIG. 5B is similar to the mask 36 in FIG. 5A. Both include the first and second reflective layers 86 and 88. However, in FIG. 5B, the main feature 80 is defined in the second mask state and the field 82 is defined in the first mask state. Particularly, in FIG. 5B, the field 82 is defined in the region of the first reflective layer 86 within the opening of the second reflective layer 88 and the main feature 80 is defined within the second reflective layer 88. Since the first and second mask states are different from each other only in phase in ideal situation. This reverse tone mask may result the same image during the subsequent exposure process. In other situations where the first and second mask states may have different absorptions, the exposure process still can be tuned with illumination mode and the pupil filter to enhance the exposure intensity with reduced the energy loss.

The second reflective layer 88 may have various compositions and configurations according to various embodiments. The second reflective layer 88 may be different from the first reflective layer 86 in terms of composition and configuration in addition to that the second reflective layer 88 is patterned according to an IC layout.

In the present embodiment, the thickness of the second reflective layer 88 is less than that of the first reflective layer 120. Thus, the step height of the second reflective layer 88 after being patterned is reduced in order to eliminate or reduce the shadow effect. In a preferred embodiment, the second reflective layer 88 has a thickness less than 70 nm, in order to effectively reduce the shadow effect for IC with small feature sizes, such as feature size of 20 nm.

Figure 6:
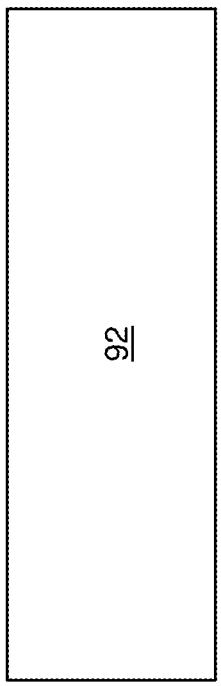
FIGS. 6-8 are a diagrammatic cross-sectional view of the second reflective layer of FIG. 5A (or 5B) constructed according to aspects of the present disclosure in various embodiments.

One embodiment of the second reflective layer 88 is illustrated in FIG. 6 in a sectional view. The second reflective layer 88 includes a single molybdenum (Mo) film 92 with a thickness ranging from about 40 nm to about 48 nm. The total thickness of the second reflective layer 88 is same to the thickness of the single Mo film 92 since the second reflective layer 88 includes only this Mo film. Thus designed second reflective layer 88 has a thickness less than about 50 nm, and furthermore is able to provide phase shift of about 180° and reflectivity of about 0.776 to the EUV radiation. State differently, the designed second reflective layer 88 provides reflectivity of about −0.776 where the sign "−" stands for 180° phase shift. Accordingly, the reflected EUV intensity is about 60% and the energy loss is about 40%.

Figure 7:
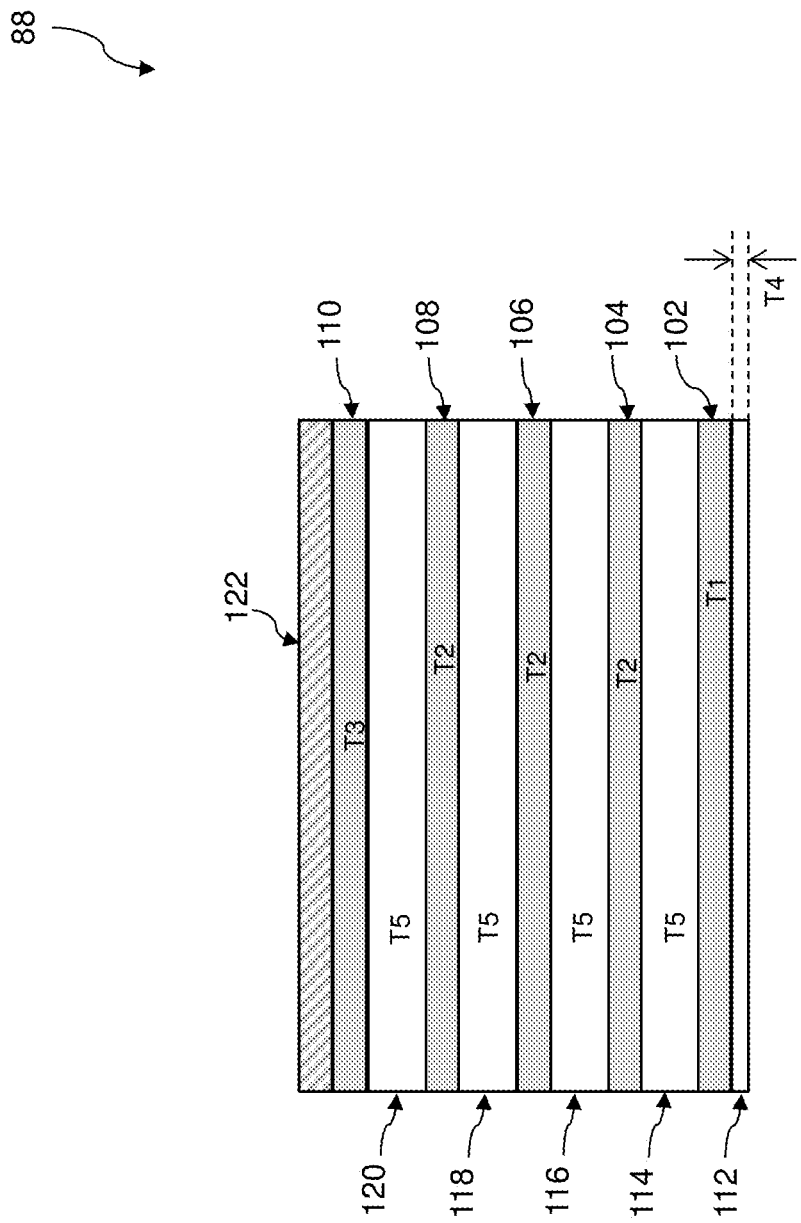

Another embodiment of the second reflective layer 88 is illustrated in FIG. 7 in a sectional view. The second reflective layer 88 includes multiple films. Particularly, the second reflective layer 88 includes five silicon films 102, 104, 106, 108 and 110; and five Mo films 112, 114, 116, 118 and 120 configured such that two adjacent Mo films sandwich a silicon film and two adjacent silicon film sandwich a Mo film. The second reflective layer 88 may further include a capping layer 122 disposed on the top silicon film 110. In the present embodiment, the silicon film 102 has a first thickness T1, the silicon films 104, 106 and 108 have a same second thickness T2 greater than the first thickness T1 and the silicon Mo film 110 has a third thickness T3 less than the first thickness T1. In the present embodiment, the Mo layer 112 has a fourth thickness T4 less than the third thickness T3, and the Mo films 114, 116, 118 and 120 have a same fifth thickness T5 greater than the second thickness T2. Those films are tuned collectively to have a thickness less than 70 nm, phase shift of about 180°, and a reflectivity to the EUV radiation such that the energy loss is less than about 40%.

In the present example, the thickness parameters T1, T2, T3, T4 and T5 are about 4 nm, about 4.3 nm, about 2.6 nm, about 1 nm and about 10. 1 nm, respectively, each being within about 20% of the nominal value. For example, the first thickness T1 ranges from about 4×(1+20%) nm to about 4×(1−20%) nm.

The capping layer 122 may be similar to the capping layer described above in FIG. 5A. In one embodiment, the capping layer 122 includes a Ru film. In furtherance of the embodiment, the capping layer 122 includes a Ru film with a thickness ranging between about 2 nm and about 5 nm. In other examples, the capping layer 122 may include Ru compounds such as ruthenium boron (RuB), ruthenium silicon (RuSi), chromium (Cr), Cr oxide, or Cr nitride.

In the present example, the reflectivity of the second reflective layer 88 is about 0.867 or about −0.867 where the sign "−" stands for 180° phase shift. Accordingly, the reflected radiation energy intensity is about 75% and the radiation energy loss is about 25%.

Figure 8:
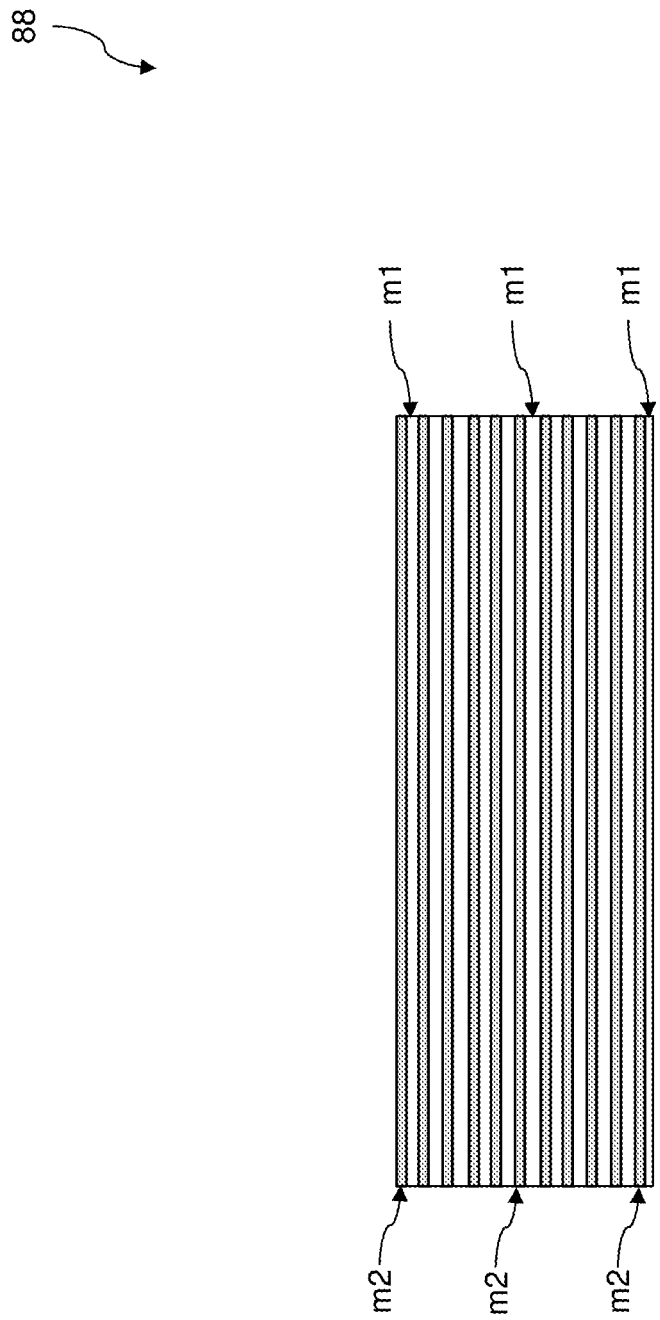

Another embodiment of the second reflective layer 88 is illustrated in FIG. 8. In this embodiment, the second reflective layer 88 is substantially similar to the first reflective layer 86 in terms of composition and configuration. The second reflective layer 88 also includes a multiple reflective layer similar to that of the first reflective layer 86. For example, the second reflective layer 88 includes a plurality of film pairs ("m1" and "m2"), such as Mo/Si film pairs (e.g., a layer of molybdenum above or below a layer of silicon in each film pair). In the present embodiment, the second reflective layer 88 includes about 15 pairs of Mo/Si film to achieving 180° phase shift. In other examples, the second reflective layer 88 alternatively include molybdenum-beryllium (Mo/Be) film pairs, or any suitable material that is highly reflective at EUV wavelengths. The thickness of each layer of the second reflective layer 88 depends on the EUV wavelength and the incident angle.

Each of the layers (such as films 102-122 in FIG. 7) may be formed by various methods, including physical vapor deposition (PVD) process, a plating process, a chemical vapor deposition (CVD) process, ion beam deposition, spin-on coating, metal-organic decomposition (MOD), and/or other methods known in the art.

The second reflective layer 88 may be patterned by a suitable patterning technique. A patterning process may include resist coating (e.g., spin-on coating), soft baking, mask aligning, exposure, post-exposure baking, developing the resist, rinsing, drying (e.g., hard baking), other suitable processes, and/or combinations thereof. An etching process is followed to remove a portion of the patterned reflective layer 88.

The mask 36 includes two mask states, 80 and 82. The mask 36 also includes a conductive layer 126 disposed on back surface of the mask substrate 84 for the electrostatic chucking purpose. In one example, the conductive layer 126 includes chromium nitride (CrN), though other compositions are possible. The mask 36 further includes a capping layer 128 formed between the first and second reflective layers 86 and 88. The capping layer 128 may include one or more films. In one example, the capping layer 128 has different etching characteristics from a second reflective layer 88. In another example, the capping layer 128 includes Ru. In furtherance of the example, the capping layer 128 includes a Ru film with a thickness ranging from about 2 to about 5 nm. In other examples, the capping layer 128 may include Ru compounds such as RuB, RuSi, chromium (Cr), Cr oxide, or Cr nitride.

Referring back to FIG. 1, the operation 12 in the method 10 may further include other steps, such as alignment after the mask 36 is secured on the mask stage.

Still referring to FIG. 1, the method 10 also includes an operation 14 to load a target 40 to the substrate stage 42 of the lithography system 30. In the present embodiment, the target 40 is a semiconductor substrate, such as a silicon wafer. The target 40 is coated with a resist layer that is sensitive to the EUV light. The resist layer is to be patterned by a lithography exposure process such that the IC design layout (IC pattern) of the mask 36 is transferred to the resist layer.

Figure 3:
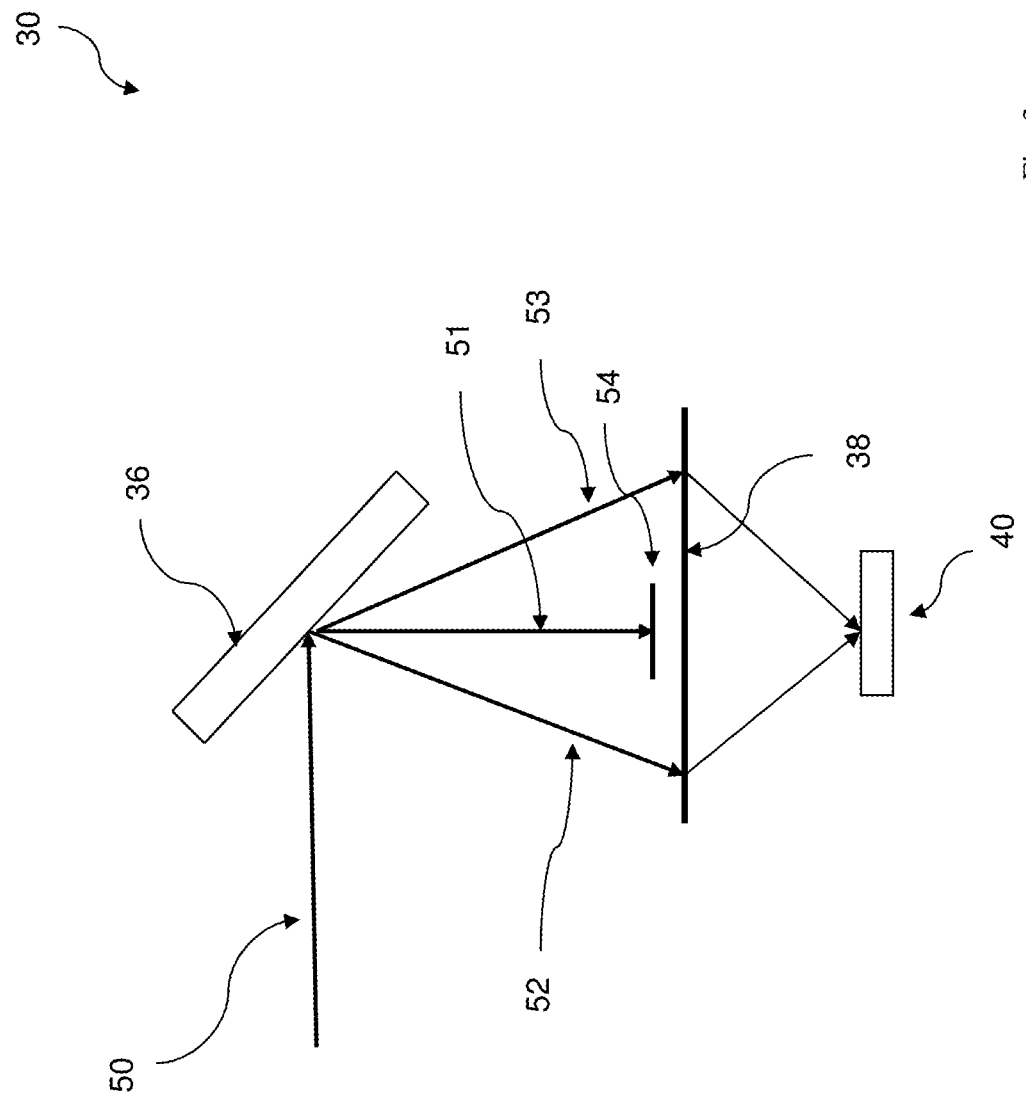
FIG. 3 is a diagrammatic perspective view of the lithography system constructed according to one embodiment.

Referring to FIG. 1, the method 10 includes an operation 16 by setting the illuminator 34 of the lithography system 30 in a highly coherent illumination mode. The illumination mode is configured such that the fill pupil ratio is less than 20% in one example. In the present embodiment, an off-axis illumination (OAI) mode is achieved. Referring to FIG. 3, an incident light ray 50, after being reflected from the mask 36, is diffracted into various diffraction orders due to presence of these mask patterns, such as a 0-th diffraction order ray 51, a −1-st diffraction order ray 52 and a +1-st diffraction order ray 53. In the depicted embodiment, the non-diffracted light rays 51 are mostly removed. The −1-st and +1-st diffraction order rays, 52 and 53, are collected by the POB 38 and directed to expose the target 40.

Figure 10A:
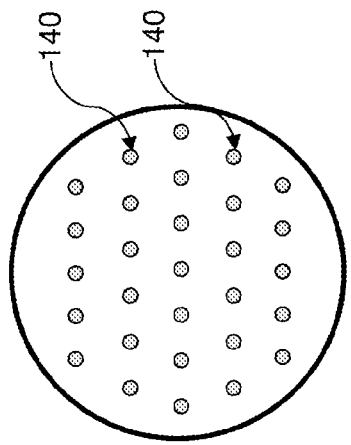
FIGS. 10A through 10C are diagrammatic top views of a pupil filter used in the lithography system of FIG. 3, constructed according to aspects of the present disclosure in various embodiments.
Figure 10B:
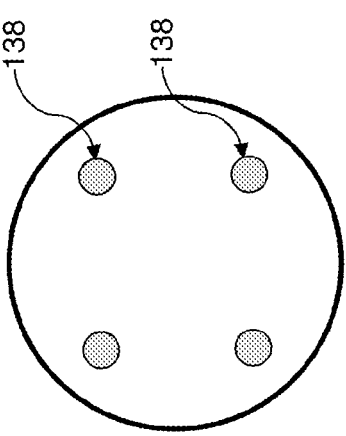
Figure 10C:
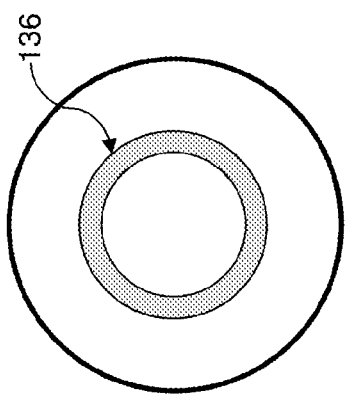

The off-axis illumination mode may be achieved by a mechanism, like an aperture with a certain pattern, such as those illustrated in FIGS. 10A-10C, constructed according to various examples. The aperture is configured at the illuminator stage to achieve the off-axis illumination mode. However, the aperture causes the EUV radiation loss.

In the present embodiment, the illuminator 34 includes various switchable mirrors or mirrors with other suitable mechanism to tune the reflections of the EUV light from those mirrors. In furtherance of the present embodiment, the off-axis illumination mode is achieved by configuring the switchable mirrors in the illumination stage such as the EUV light from the radiation source 32 is directed into a pattern (such as those shown in FIGS. 9A-9C) to achieve the off-axis illumination.

Figure 9A:
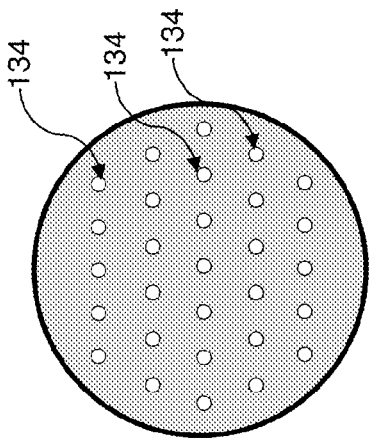
FIGS. 9A through 9C are diagrammatic top views of an illuminator used in the lithography system of FIG. 3, constructed according to aspects of the present disclosure in various embodiments.
Figure 9B:
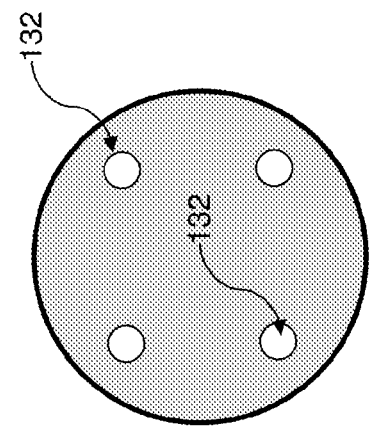
Figure 9C:
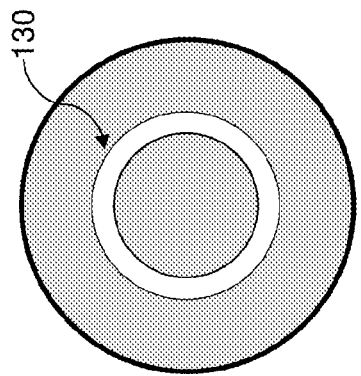

The illumination mode may include different patterns, such as those examples in FIGS. 9A-9C. The illumination pattern is determined according to the IC pattern defined on the mask 36 for the expected purpose that includes enhancing the intensity of the EUV light during the lithography exposure process.

In FIG. 9A, the illumination mode has an annular pattern 130 where the annular portion 130 is the region being transparent (or in "on" state) to the light from the radiation source 32 and the other portions are in "off" state (blocking). The "on" region means that when the light reaches the region it will be directed to the mask 36. The "off" region means that when the light reaches the region it will be blocked from reaching the mask 36. Those terms are also used to describe the pupil filter. For the present example in FIG. 9A, the EUV light reaching the annular portion 130 will be directed to the mask 36 while the EUV light reaching the "off" portions will be blocked.

In FIG. 9B, the illumination mode has a quasar pattern 132 where the quasar portions 132 are in "on" state and the rest portions are in "off" state. In other words, the EUV light reaching the quasar portions 132 will be directed to the mask 36 while the EUV light reaching the rest portions will be blocked.

In FIG. 9C, the illumination mode has a scattering pattern 134. The EUV light directed to the scattering portions 134 will be directed to the mask 36 while the EUV light to the rest portions will be blocked.

Referring to FIG. 1, the method 10 may include an operation 18 by configuring a pupil filter 54 in the lithography system 30. The pupil filter 54 is configured in a pupil plane of the lithography system 30. In an image optical system, there is a plane with field distribution corresponding to Fourier Transform of object (the mask 36 in the present case). This plane is called pupil plane. The pupil filter 54 is placed in the pupil plane to filter out specific spatial frequency components of the EUV light directed from the mask 36.

The pattern defined in the pupil filter 54 is determined by the illumination mode. In the present embodiment, the pupil filter 54 is designed to filter out the non-diffracted portion of the illuminated light directed from the mask 36. In furtherance of the present embodiment, the pupil filter 54 matches the illumination mode but is complimentary. In furtherance of the embodiment, the pattern in the pupil filter 54 is substantially similar to the pattern of the illumination mode. For example, when the illumination mode is defined as the annular pattern in FIG. 9A, the pattern of the pupil filter 54 is also the same annular pattern 136 illustrated in FIG. 10A. However, the pattern of the pupil filter in FIG. 10A is complimentary to the pattern defined in the illumination mode in FIG. 9A. Particularly, the annular portion 136 is in the "off" state where the EUV light reaches this portion in the pupil plane will be blocked. The EUV light reaches to other portion in the pupil plane will be directed to the target 40 ("on" state). Similarly, when the illumination mode is defined in FIG. 9B, the corresponding pupil filter will have a pattern illustrated in FIG. 10B, wherein the quasar portions 138 are in "off" state while the other portions are in the "on" state. In another example, when the illumination mode is defined in FIG. 9C, the corresponding pupil filter will have a pattern illustrated in FIG. 10C, wherein the scattering portions 140 are in "off" state while the other portions are in the "on" state.

In another embodiment, the pupil filter may have a pattern slightly different from the pattern defined in the illumination mode. For example, the pupil filter has an "off" pattern larger than the "on" pattern of the corresponding illumination mode such that the corresponding "on" region in the illumination mode is covered with an enough margin. Other illumination modes and the corresponding pupil filters may be used according to other examples.

Figure 11A:
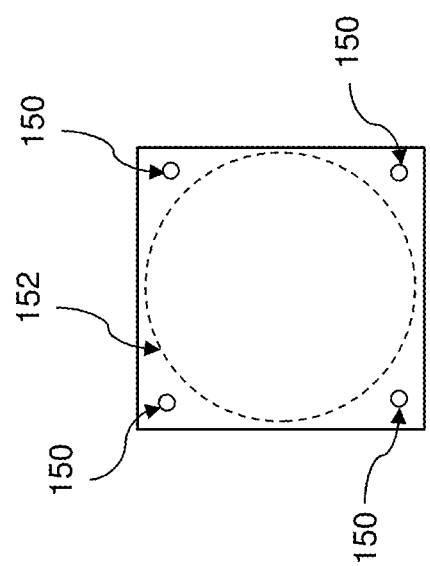
FIGS. 11A and 11B are diagrammatic top views of a pupil filter used in the lithography system of FIG. 3, constructed according to other embodiments.
Figure 11B:
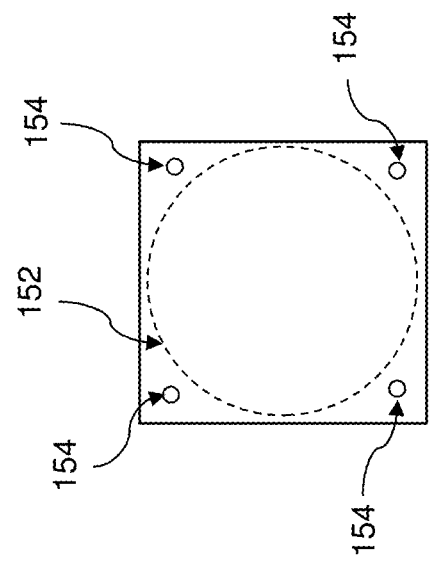

In yet another embodiment, where the illuminator source is out of pupil or partial coherence sigma is >1, the pupil filter is eliminated. As one example illustrated in FIG. 11A, the "on" regions 150 in the illumination mode are illustrated. The full pupil 152 in the pupil plane is illustrated in FIG. 11A in the region within the dashed line for reference. The "on" region 150 in the illumination mode is out of the full pupil 152. In this case, the sigma center is greater than 1. In this particular example, the sigma center is 1.2 and sigma radius is 0.05. There is no need to utilize a pupil filter in the pupil plane. Another example is illustrated in FIG. 11B, where the "on" region 154 is out of the full pupil 152. In this case, the sigma center is 1.15 greater than 1 and sigma radius is 0.05. As a result, there is no need to utilize the pupil filter in the pupil plane.

Referring back to FIG. 1, the method 10 proceeds to operation 20 by performing a lithography exposure process to the target 40 in the configured illumination mode and the pupil filter (in the cases where the pupil filter is needed). The EUV light from the radiation source 32 is modulated by the illuminator 34 with the EUV energy distribution for the off-axis illumination, directed from the mask 36, and further filtered by the pupil filter, the EUV light images the IC pattern of the mask 36 to the target with enhanced light.

Figure 13:
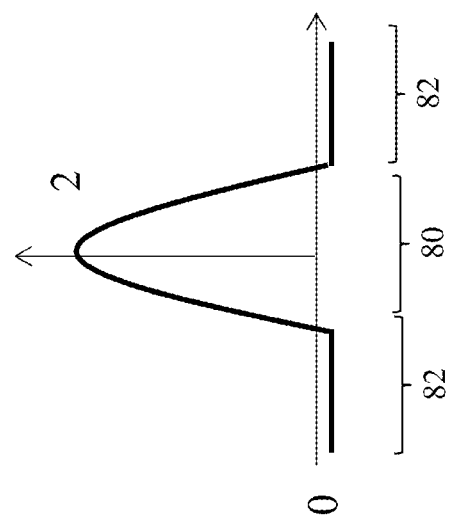
FIG. 13 illustrates the exposure light field distribution after the pupil filter constructed according to aspects of the present disclosure in one embodiment.
Figure 12:
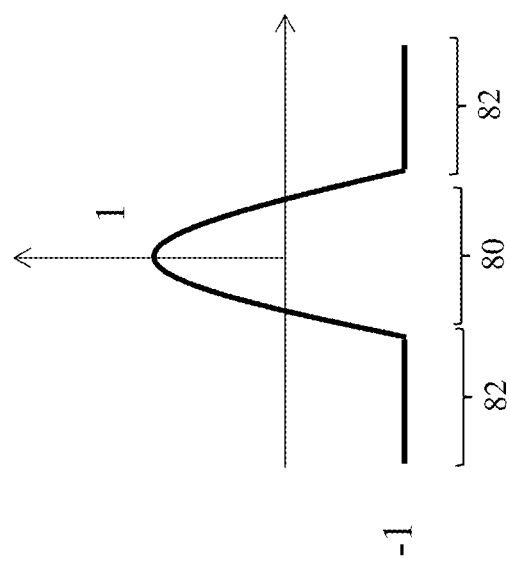
FIG. 12 illustrates the exposure light field distribution before the pupil filter constructed according to aspects of the present disclosure in one embodiment.

This is illustrated and described below with reference to FIGS. 12-13 and other figures. FIGS. 12 and 13 are diagrammatical view of the spatial distribution of EUV light. The horizontal axis represents spatial dimension and the vertical axis represents the amplitude of the EUV light. In the present embodiment for the illustration, the mask pattern is the IC pattern defined in FIG. 4. The main feature is 80 in the first mask state and the field 82 is in the second mask state. Accordingly, the EUV light distribution after directed from the mask 36 is illustrated in FIG. 12. The light amplitude corresponding to the first mask state (the main feature 80) is about 1 (in a relative unit assuming the full amplitude before reaching the mask is 1). This means the EUV light associated with the main feature 80 is fully reflected without energy loss and the phase is 0. In contrast, the light amplitude corresponding to the second mask state (the field 82) is about −1 (in the relative unit). This means the EUV light associated with the field 82 is fully reflected without energy loss and the phase is 180° relative to that of the main feature.

The EUV light from the mask 36 is further filtered by the pupil filter in the pupil plane such that a portion of the EUV light with a certain spatial frequency is filtered out. In the present embodiment, the non-diffracted component of the EUV light is filtered out. In one example, the EUV component of the $0^{th}$ spatial frequency is filtered out. The EUV light spatial distribution after the pupil filter is illustrated in FIG. 13. The light amplitude corresponding to the first mask state (the main feature 80) is about 2 and the light amplitude corresponding to the second mask state (the field 82) is about 0. Therefore, the amplitude of the EUV light corresponding to the first mask state is about doubled. Accordingly, the intensity of the EUV light corresponding to the first mask state is about four times greater. This is achieved by the designed illumination mode and the structure of the mask 36 (and additionally contributed by the corresponding pupil filter). In other embodiment, the first and second mask states may experience certain energy loss due to the absorption, and the overall EUV intensity is still substantially enhance, such as about 3 times greater than the original EUV intensity.

Figure 14:
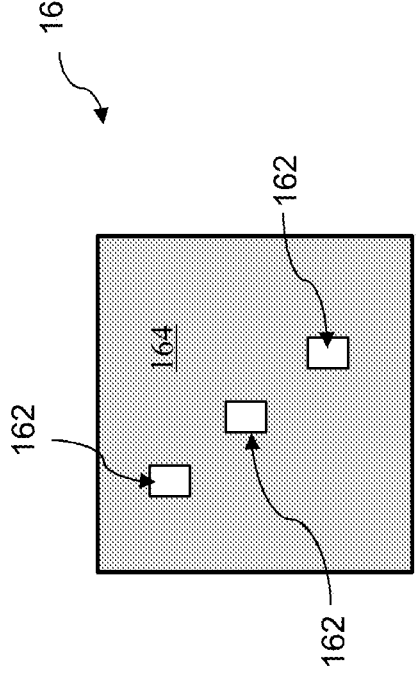
FIG. 14 is a schematic view of an integrated circuit (IC) pattern constructed according to aspects of the present disclosure in one embodiment.
Figure 16:
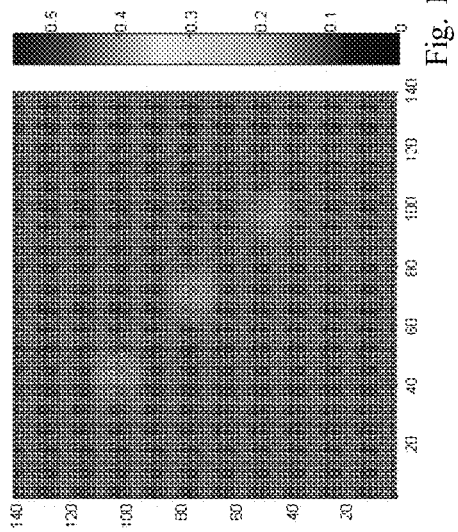
FIG. 16 is a schematic view of an image of the IC pattern of FIG. 14 on the target using the BIM, constructed according to one embodiment.
Figure 15:
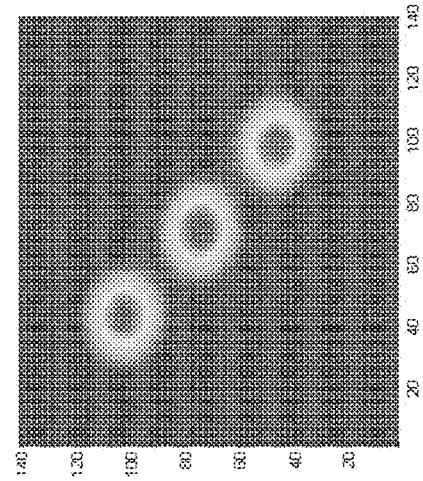
FIG. 15 is a schematic view of an image of the IC pattern of FIG. 14 on the target using the BPM, constructed according to aspects of the present disclosure in one embodiment.

One real example is further illustrated in FIGS. 14-16. FIG. 14 illustrates an IC pattern 160. The IC pattern 160 includes various main features 162 (three exemplary main features in this example) and the filed 164. By implementing the method 10 with the mask 36, the image of the IC pattern on the target 40, illustrated in FIG. 15, is achieved with high intensity. In this case, the IC pattern is defined on the BPM 36. In the present embodiment, the main features 162 are defined in one of the first and second mask states. The field 164 is defined in another mask state.

As a comparison, when the IC pattern is defined in a conventional mask, such as a binary intensity mask, the corresponding image of the IC pattern on the target, as illustrated in FIG. 16, has a low intensity. Other benefits of the method 10 includes reduced mask error enhancement factor (MEEF) and reduced printability of particles on the mask. The MEEF reduction is further described according to different examples.

Figure 17:
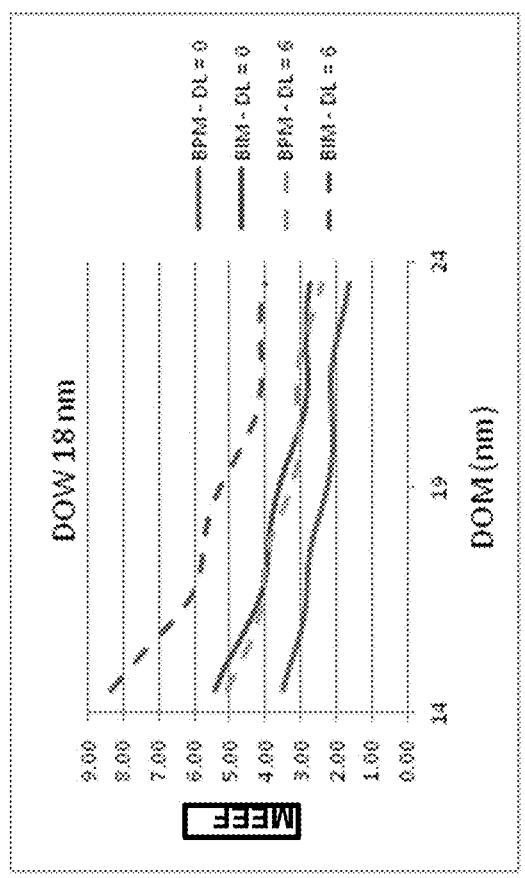
FIG. 17 illustrates diagrammatically the mask error enhancement factor (MEEF) over the dimension on mask (DOM), constructed according to various embodiments.

FIG. 17 illustrates diagrammatically the MEEF for various methods. MEEF is defined as $M*(\Delta CD_w)/(\Delta CD_m)$, where $\Delta CD_w$ is the CD change of a feature in wafer and $\Delta CD_m$ is the CD change of the feature in the mask. The horizontal axis represents dimension on mask (DOM) in nanometer (nm). The vertical axis represents MEEF. The dimension on wafer (DOW) is about 18 nm in the present example. FIG. 17 includes four curves. The first curve represents the data from the lithography exposure process using the mask 36 (BPM) with photoresist diffusion length (DL)=0 nm corresponding to ideal resist, labeled in the legend as "BPM-DL=0". The second curve represents the data from the lithography exposure process using a binary intensity mask with DL=0 nm, labeled in the legend as "BIM-DL=0". The third curve represents the data from the lithography exposure process using the mask 36 with DL=6 nm, labeled in the legend as "BPM-DL=6". The fourth curve represents the data from the lithography exposure process using a binary intensity mask with DL=6 nm, labeled in the legend as "BIM-DL=6". FIG. 17 clearly demonstrates that the MEEF is substantially reduced by utilizing the method 10 with the mask 36.

Figure 18:
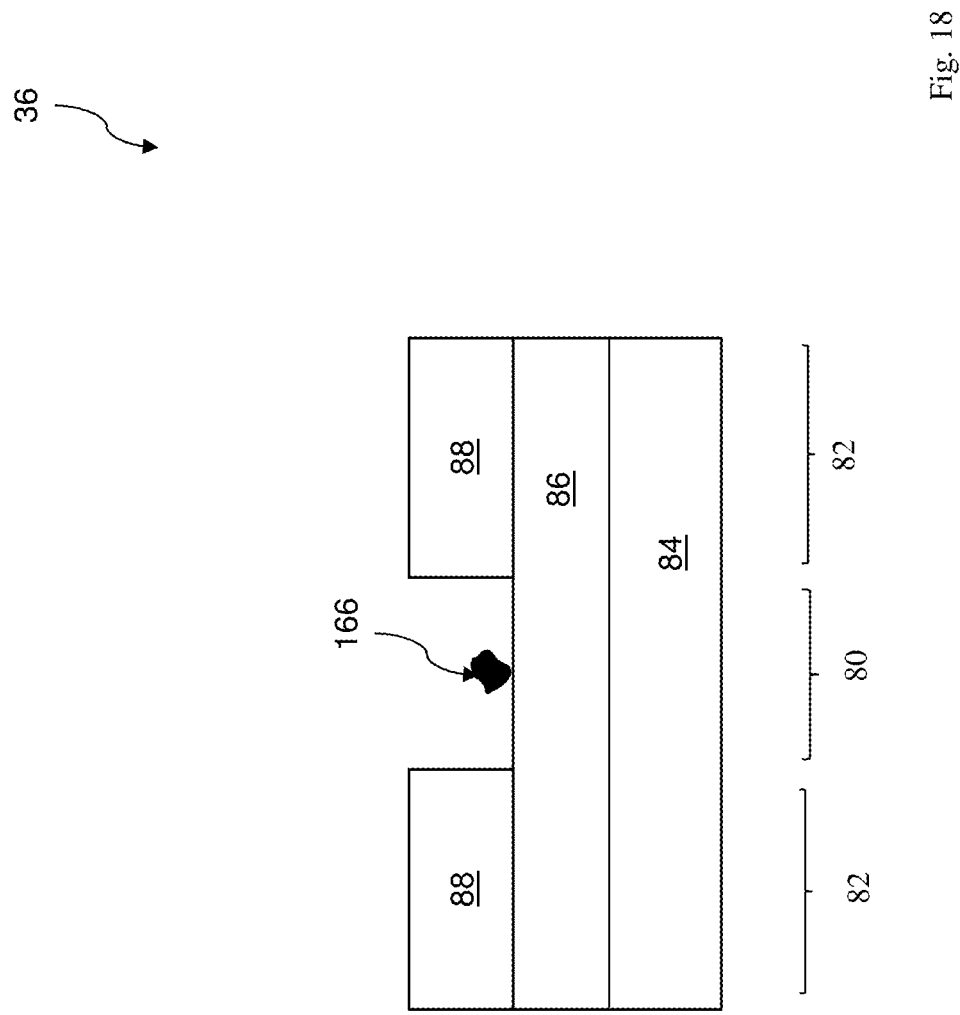
FIG. 18 is a diagrammatic cross-sectional view of the binary phase mask with an exemplary particle constructed according to aspects of the present disclosure in one embodiment.

FIG. 18 illustrates the mask 36 that is the same mask illustrated in FIG. 5A. However, there is an exemplary particle 166 falling on the mask 36 in FIG. 18. According to the similar analysis in FIGS. 12 and 13, the EUV light distribution in amplitude before the pupil filter is similar to the one in FIG. 12 but the region corresponding to the particle completely lost the EUV light or the corresponding amplitude is 0. After the pupil filter, the EUV light distribution in amplitude is similar to the one in FIG. 13 but the region corresponding to the particle has the amplitude as 1. Accordingly, the EUV intensity to the field is 0, to the main feature 4 and to the particle is 1. The relative EUV intensity to the particle 166 is non-zero, which is different from the intensity to the field. The printability of the particle is reduced.

In contrast, the particle falling on the main feature in a binary intensity mask will cause the total loss of the EUV light reaching thereto, resulting in an unexposed region as a defect.

Referring back FIG. 1, the method 10 may further include other operations. For example, the method 10 includes an operation 22 by developing the exposed resist layer coated on the target 40, thereby forming a patterned resist layer with one or more openings imaged from the IC pattern defined on the mask 36.

In another example, the method 10 further includes an operation 24 by performing a fabrication process to the target 40 through the patterned resist layer. In one embodiment, the substrate or a material layer of the target is etched through the openings of the patterned resist layer, thereby transferring the IC pattern to the substrate or the underlying material layer. In furtherance of the embodiment, the underlying material layer is an interlayer dielectric (ILD) layer disposed on the semiconductor substrate. The etching process will form contacts or vias in the corresponding ILD layer. In another embodiment, an ion implantation process is applied to the semiconductor substrate through the openings of the patterned resist layer, thereby forming doped features in the semiconductor substrate according to the IC pattern. In this case, the patterned resists layer functions as an ion implantation mask.

Various embodiments of the method 10 and the mask 36 are described according to the present disclosure. Other alternatives and modifications may present without departure from the spirit of the present disclosure. In one embodiment, the IC pattern defined on the mask 36 may further include various assist polygons incorporated by an OPC process. In one example, the assist polygons are assigned to a same state. For example, the assist polygons are assigned to the first mask state. In another embodiment, the binary phase mask 36 may have other structure to achieve the same functions, such as enhancing the exposure intensity by the method 10. In various examples, the resist material is assumed as a positive tone resist and the main features achieve the high exposure intensity. However, in one embodiment, the resist layer may be a negative tone resist.

As described above in various embodiments, the present disclosure provides a method for extreme ultraviolet lithography (EUVL) exposure process to pattern an IC pattern, especially an IC pattern with a low pattern density, with enhanced intensity by using a binary phase mask, off-axis illumination mode and corresponding pupil filter. Especially, the illumination mode is determined by the IC pattern defined on the binary phase mask and the pattern of the pupil filter is determined according to the illumination mode. In one embodiment, the illuminator includes a plurality of mirrors configured to generate the illumination mode. The pupil filter is configured in the pupil plane of the lithography system and is designed to filter out a portion of the EUV light with a certain spatial frequency. In the present example, the non-diffracted component of the EUV light is filtered out. In another embodiment, the pupil filter may be eliminated during the lithography exposure process when the sigma center in the illumination mode is greater than 1.

Various advantages may present in different embodiments of the present disclosure. In one example, the exposure intensity is enhanced. Accordingly, the exposure duration is reduced and the throughput is increased, especially for the IC pattern with a low pattern density. By utilizing the highly coherent illumination mode and corresponding pupil filtering, the energy loss is substantially reduced. In one example for illustration, the pupil fill ratio (the relative energy loss by the pupil filter) is much less, such as less than about 20%. The exposure light amplitude to the main features is substantially increased and the MEEF is reduced. In another example, the printability of the falling particles is mitigated.

Thus, the present disclosure provides a method for extreme ultraviolet lithography (EUVL) process in some embodiments. The method includes loading a binary phase mask (BPM) to a lithography system, wherein the BPM includes two phase states and defines an integrated circuit (IC) pattern thereon; setting an illuminator of the lithography system in an illumination mode according to the IC pattern; configuring a pupil filter in the lithography system according to the illumination mode; and performing a lithography exposure process to a target with the BPM and the pupil filter by the lithography system in the illumination mode.

The present disclosure also provides a method for EUVL process in other embodiments. The method includes loading a binary phase mask (BPM) to a lithography system, wherein the BPM includes two phase states and defines an integrated circuit (IC) pattern thereon; setting an illuminator of the lithography system in a highly coherent illumination mode according to the IC pattern; and performing a lithography exposure process to a resist layer coated on a target with the BPM and the illuminator in the illumination mode.

The present disclosure also provides a method for EUVL process in one or more embodiments. The method includes loading a binary phase mask (BPM) to a lithography system, wherein the BPM includes two phase states and defines an integrated circuit (IC) pattern with a pattern density less than 25%; setting switchable mirrors in an illuminator of the lithography system in an illumination mode; configuring a pupil filter in a pupil plane of the lithography system, wherein the pupil filter has a pattern determined according to the illumination mode; and performing a lithography exposure process to a target with the BPM and the pupil filter by the lithography system in the coherent illumination mode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for extreme ultraviolet lithography (EUVL) process, comprising:
    loading a binary phase mask (BPM) to a lithography system, wherein the BPM includes two phase states and defines an integrated circuit (IC) pattern thereon, wherein the BPM includes a first phase state of the two phase states at a greater occurrence than a second phase state of the two phase states;
    setting an illuminator of the lithography system in an illumination mode according to the IC pattern;
    providing EUV light from the illuminator in the illumination mode to the BPM;
    reflecting the EUV light from the BPM
    configuring a pupil filter in the lithography system according to the illumination mode;
    using the pupil filter, filtering out a non-diffracted component of the reflected EUV light from the first state and the second state, wherein an average amplitude of the filtered non-diffracted component is substantially near an amplitude of EUV light reflected from the first state;
    increasing an amplitude of a diffracted component of the reflective EUV light, wherein the amplitude of the reflected EUV light diffracted from the second state is approximately doubled after the filtering; and
    exposing a photoresist layer with the diffracted component having the increased amplitude.

2. The method of claim 1, wherein the BPM includes a first reflective layer disposed on a mask substrate; and a second reflective layer disposed on the first reflective layer and patterned according to the IC pattern.

3. The method of claim 1, wherein the first and second mask phase states are designed to have a phase shift of 180°.

4. The method of claim 2, wherein the IC pattern has a pattern density less than 25% of the second phase state.

5. The method of claim 2, wherein the IC pattern has a pattern density greater than 75% of the first phase state.

6. The method of claim 1, wherein the illumination mode is set to achieve an off-axis illumination.

7. The method of claim 1, wherein the setting of the illuminator includes setting a plurality of switchable mirrors to achieve the illumination mode.

8. The method of claim 1, wherein the pupil filter has a pattern matching to a pattern defined in the illumination mode.

9. The method of claim 1, wherein the illuminator has a fill pupil ratio less than 20%.

10. A method for extreme ultraviolet lithography (EUVL) process, comprising:
    loading a binary phase mask (BPM) to a lithography system, wherein the BPM includes two phase states and defines an integrated circuit (IC) pattern thereon, wherein the two phase states include a first phase state and a second phase state;
    setting an illuminator of the lithography system in a coherent illumination mode according to the IC pattern;
    providing EUV light from the illuminator to the BPM;
    reflecting the EUV light from the BPM, wherein the reflecting include non-diffracted light and diffracted light from each of the first phase state and the second phase state;
    using a pupil filter to filter out a non-diffracted light from each of the first state and the second state, wherein the filtered out non-diffracted light is predominately from the second mask state;
    wherein the filtering the non-diffracted light predominately from the second mask state increases an intensity of the diffracted light from the first mask state by a factor of between three and four; and
    using the non-diffracted light to expose a resist layer coated on a target with the BPM and the illuminator in the illumination mode.

11. The method of claim 10, wherein the BPM includes a mask substrate having a first region and a second region; a multilayer mirror disposed on the mask substrate over both the first and second regions; and a phase-shift layer disposed over the multilayer mirror in the second region, wherein the IC pattern defined on the BPM has a pattern density less than 25% for the first mask state.

12. The method of claim 10, wherein
the setting of the illuminator includes setting a plurality of switchable mirrors to achieve the coherent illumination mode; and
the highly coherent illumination mode is out of a pupil region of the lithography system.

13. The method of claim 10, wherein the pupil filter has a filter pattern substantially matching to an illumination pattern defined in the illuminator.

14. The method of claim 13, wherein
the illumination pattern includes an illumination portion with a first geometry and a blocking portion with a second geometry; and
the filter pattern includes a blocking portion with the first geometry.

15. The method of claim 14, wherein the illumination pattern includes an annular pattern as the illumination portion and the pupil filter includes the annular pattern as the blocking portion.

16. The method of claim 14, wherein the illumination pattern includes a quasar pattern as the illumination portion and the pupil filter includes the quasar pattern as the blocking portion.

17. A method for extreme ultraviolet lithography (EUVL) process, comprising:
loading a binary phase mask (BPM) to a lithography system, wherein the BPM includes two phase states and defines an integrated circuit (IC) pattern with a pattern density less than 25%;
setting switchable mirrors in an illuminator of the lithography system in an illumination mode;
configuring a pupil filter in a pupil plane of the lithography system, wherein the pupil filter has a pattern determined according to the illumination mode; and
performing a lithography exposure process to a target with the BPM and the pupil filter by the lithography system in the coherent illumination mode, wherein the lithography exposure process includes:
providing an EUV light reflected from a first state of the BPM and having a first amplitude;
filtering out a non-diffracted component of the EUV light, wherein the filtering out includes predominately filtering non-diffracted component from a second state of the two states of the BPM; and
providing a diffracted component of the EUV light from the first state after the filtering having a second amplitude, the second amplitude approximately double the first amplitude.

18. The method of claim 1, wherein the second state of the BPM defines a cut feature for a multiple patterning process.

19. The method of claim 1, wherein the second state of the BPM defines a dummy feature.

* * * * *